(12) United States Patent
Mori et al.

(10) Patent No.: US 8,333,915 B2
(45) Date of Patent: Dec. 18, 2012

(54) FINE-STRUCTURE TRANSFER METHOD

(75) Inventors: Kyoichi Mori, Kodama-gun (JP);
Naoaki Yamashita, Kodama-gun (JP);
Noritake Shizawa, Kodama-gun (JP);
Koji Tsushima, Kodama-gun (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/238,735

(22) Filed: Sep. 21, 2011

(65) Prior Publication Data
US 2012/0007280 A1    Jan. 12, 2012

Related U.S. Application Data

(62) Division of application No. 12/711,377, filed on Feb. 24, 2010, now Pat. No. 8,096,800.

(30) Foreign Application Priority Data

Feb. 27, 2009 (JP) .................... 2009-045623

(51) Int. Cl.
*B29C 47/00* (2006.01)
*B29C 49/00* (2006.01)
(52) U.S. Cl. ........... 264/85; 264/284; 264/293; 977/887
(58) Field of Classification Search .................... 264/85, 264/284, 293; 977/887
See application file for complete search history.

(56) References Cited

U.S. PATENT DOCUMENTS

| 5,772,905 | A | 6/1998 | Chou | |
|---|---|---|---|---|
| 7,316,554 | B2 | 1/2008 | Choi et al. | |
| 2004/0211755 | A1* | 10/2004 | Yusa et al. | 216/54 |
| 2005/0072755 | A1 | 4/2005 | McMackin et al. | 216/44 |
| 2007/0065532 | A1* | 3/2007 | Choi et al. | 425/375 |
| 2007/0066750 | A1* | 3/2007 | Houle et al. | 524/588 |
| 2007/0093079 | A1 | 4/2007 | Aruga et al. | |
| 2008/0042319 | A1 | 2/2008 | Ando et al. | |
| 2009/0039560 | A1 | 2/2009 | Nishikawa et al. | |
| 2010/0078860 | A1* | 4/2010 | Yoneda et al. | 264/496 |

FOREIGN PATENT DOCUMENTS

| JP | 2004-103817 A | 4/2004 |
|---|---|---|
| JP | 2008-12844 A | 1/2008 |
| JP | 2008-12858 A | 1/2008 |

* cited by examiner

Primary Examiner — Yogendra Gupta
Assistant Examiner — Jeremiah Smith
(74) Attorney, Agent, or Firm — Mattingly & Malur, PC

(57) ABSTRACT

A fine-structure transfer method in which a fine-featured pattern formed on one of the two surfaces of a stamper is pressed against a coating of a resist on one of the two surfaces of a transfer element so as to transfer the fine-featured pattern to the resist coating, wherein the atmosphere in the space between the stamper and the transfer element is replaced by the vapor of the resist before the stamper is pressed against the transfer element.

7 Claims, 4 Drawing Sheets

FINE-STRUCTURE TRANSFER METHOD

This application is a divisional of U.S. patent application Ser. No. 12/711,377, filed Feb. 24, 2010, now pending, the contents of which are hereby incorporated by reference into this application. This application claims priority of JP 2009-045623 filed Feb. 27, 2009.

TECHNICAL FIELD

The present invention relates to a fine-structure transfer apparatus and method that are capable of forming fine structures on a surface of a transfer element. More particularly, the present invention relates to a fine-structure transfer apparatus and method that will not cause a problem of air bubbles while a stamper is pressed against a surface of the transfer element.

BACKGROUND ART

With remarkable advances in the performance of computers and other information equipment, the volume of information that is handled by users has been constantly increasing and the unit of measurement is now in terabytes rather than gigabytes. Under these circumstances, there exists an ever-growing demand for semiconductor devices such as information storage/reproduction equipment and memories that are capable of recording at even higher densities.

To achieve higher recording densities, technologies for even finer microfabrication are required. Conventional photolithography which uses the exposure process is capable of microfabrication over a large area in one step; however, since its resolution is not finer than the wavelength of light, conventional photolithography is inevitably unsuitable for creating fine structures smaller than the wavelength of light (say, 100 nm and less). Technologies currently available for processing finer structures than the wavelength of light include exposure using electron beams, exposure using X-rays, and exposure using ion beams. However, pattern formation with an electron beam lithographic apparatus differs from patterning by one-shot exposure using such light sources as i-line and an excimer laser in that the more patterns that need be written with electron beams, the longer the time that is required for writing (exposure). Therefore, as the recording density increases, the time it takes to form a fine-featured pattern is prolonged to cause a marked drop in throughput. With a view to forming patterns at a faster speed by the e-beam lithographic equipment, the development of a method for one-shot irradiation of geometric figures is underway in which combinations of variously shaped masks are subjected to one-shot exposure to electron beams; however, the e-beam lithographic apparatus that uses the method for one-shot irradiation of geometric figures is not only bulky but it also needs an additional mechanism for controlling the positions of masks to an even higher precision. This increases the cost of the lithographic apparatus, eventually leading to a higher cost for manufacturing media.

Printing-based approaches have been proposed as an alternative to the conventional exposure technologies for creating fine structures smaller than the wavelength of light. See, for example, U.S. Pat. No. 5,772,905A which describes an invention relating to the technology of nanoimprint lithography (NIL). The technology of nanoimprint lithography (NIL) is a technique in which a pattern of predetermined fine structures is formed on a mold by exposure to electron beams or using some other methods of creating finer structures than the wavelength of light and the mold is urged under pressure against a resist-coated transfer substrate so that the fine-structured pattern is transferred to the resist coating on the transfer substrate. As long as the mold is available, there is no particular need to employ an expensive exposure unit but an apparatus in the class of ordinary printing presses will suffice to produce replicas in large quantities; hence, in comparison with the conventional methods such as exposure to electron beams, there is achieved a marked improvement in throughput whereas the manufacturing cost is significantly reduced.

As described in U.S. Pat. No. 5,772,905A, when a thermoplastic resin (say, PMMA) is used as a resist material in the technology of nanoimprint lithography (NIL), transfer is performed with the thermoplastic resin being heated under pressure to a temperature near its glass transition temperature (Tg) or higher. This approach is called a heat transfer process. The heat transfer process has the advantage of permitting the use of general-purpose, thermoplastic resins. If a photosensitive resin is used as a resist in the NIL technology, a photo-curable resin that hardens upon exposure to light such as UV radiation is chosen as the resin to which the original fine-featured pattern is transferred. This approach is called an optical transfer process.

In the nanoimprint processing technology using the optical transfer process, a special photocurable resin must be used but, on the other hand, compared to the heat transfer process, the optical transfer process has the advantage of reducing the dimensional errors in finished products due to the thermal expansion of transfer printing plates or printing media. Other advantages that are related to the apparatus include elimination of the need for equipping it with a heating mechanism and providing accessories such as for performing temperature elevation, temperature control, and cooling. There is a further advantage concerning the nanoimprint apparatus taken as a whole and that is elimination of the need for design considerations against thermal distortions, such as heat insulation.

An example of nanoimprint apparatuses based on the optical transfer process is described in JP2008-12844A. This apparatus is so designed that a stamper capable of transmitting UV light is urged against a photocurable resin coated transfer substrate and irradiated with UV light from above. A predetermined pattern of fine structures is formed in that surface of the stamper which is to be pressed against the transfer substrate.

FIGS. 6 (6(a) to 6(d)) in the accompanying drawings are schematic diagrams showing major steps in a fine-structure transfer method involving the nanoimprint technology based in the optical transfer process. In step (a), a transfer element 100 comprising a substrate 102 coated with a resist 104 on its topside is placed in a face-to-face relationship with a stamper 108 having a fine-featured pattern 106 formed on the side that is to be brought into contact with the resist 104. In step (b), the stamper 108 is pressed against the resist-coated surface of the transfer element 100. In step (c), ultraviolet (UV) light is applied to the stamper 108 from above, whereby the resist 104 is hardened. Then, in step (d), the stamper 108 is detached from the transfer element 100, leaving a patterned layer 110 on a surface of the substrate 102 of the transfer element 100. The patterned layer 110 is the obverse image of the fine-featured pattern 106.

In the nanoimprint technology, whether it is based on the heat transfer or optical transfer process, if the pressing of the stamper in the position shown in step (a) of FIG. 6 into intimate contact with the resist as shown in step (b) is performed in the atmosphere, air bubbles are trapped in the space between the recesses in the fine-featured pattern 106 on the stamper 108 and the resist 104 and even after the pressing action is finished, those air bubbles will stay, causing the external shape of the resist to be fixed as irregularly deformed.

This makes it difficult or even impossible to ensure that the shape of the fine-featured pattern 106 is transferred correctly.

With a view to solving this problem of air bubbles, JP2008-12844A proposes a design as depicted in its accompanying FIG. 1, in which a plate on top of a stage on which a transfer element is to be placed has such a curved shape that it is highest in the central portion and becomes lower in a radial direction toward the outer periphery, with the result that when the stamper is pressed against the transfer element, the pressure applied to the transfer element is transmitted from the center outward, whereby air bubbles will be released to the outside of the transfer element. Briefly, pressure is applied with a certain gradient so that air as a compressive fluid is ejected from the outer edges of the transfer element. However, this method requires a great force to press the stamper.

FIG. 1 accompanying JP 2008-12858A depicts an imprint apparatus that contains a transfer element and a stamper within a vacuum chamber, the transfer element and the stamper being brought into contact with each other in a vacuum to thereby prevent any air bubbles from remaining between the stamper and the transfer element. However, this apparatus requires a vacuum chamber of complicated structure.

Further, FIG. 1 accompanying JP 2004-103817A depicts an imprint apparatus comprising a working compartment from which the gas in its interior can be evacuated by an exhaust device and into which a condensable gas of specified properties can be supplied from a condensable gas feeding device, further characterized in that after the space between a surface of the transfer element and a mold is filled by a condensable gas atmosphere, the mold is pressed against a resist layer on the surface of the transfer element to perform a transfer operation. A gas to be selected as the condensable gas of specified properties is such that it condenses when, during imprinting, the resist layer gets into the recesses in a surface of the mold to compress the gas in its interior, and it may be exemplified by trichlorofluoromethane. As a result of this condensation, the volume of the internal gas becomes negligibly small, preventing the generation of defects due to gas confinement in the recesses in a surface of the mold. However, since this apparatus requires a gas replacing means, the structure of the working compartment inevitably becomes complicated and bulky. As a further problem, the chemical effects the condensable gas used might have on the resist are yet to be studied and some unexpected inconvenience may potentially occur.

SUMMARY OF THE INVENTION

An object, therefore, of the present invention is to provide a fine-structure transfer method by which a fine-featured pattern on a stamper can be correctly transferred to a transfer element without allowing air bubbles to remain between the stamper and the transfer element.

Another object of the present invention is to provide a fine-structure transfer apparatus by which a fine-featured pattern on a stamper can be correctly transferred to a transfer element without allowing air bubbles to remain between the stamper and the transfer element.

The first object of the present invention can be attained by a fine-structure transfer method in which a fine-featured pattern formed on one of the two surfaces of a stamper is pressed against a coating of a resist on one of the two surfaces of a transfer element so as to transfer the fine-featured pattern to the resist coating, wherein the atmosphere in the space between the stamper and the transfer element is replaced by the vapor of the resist before the stamper is pressed against the transfer element.

The second object of the present invention can be attained by a fine-structure transfer apparatus having at least a stamper and a stage on which to place a transfer element having a coating of a resist, further having a device for heating the resist coating to be vaporized.

The second object of the present invention can also be attained by a fine-structure transfer apparatus having at least a stamper and a stage on which to place a transfer element having a coating of a resist, further having a device for supplying the vapor of the resist into the space between the stamper and the transfer element.

According to the present invention, there is no need to use a curved stage or a vacuum chamber of a complicated structure that has been used in the prior art, nor is there a need to use a condensable gas of a dissimilar material from the resist. The air can be purged out of the space between the stamper and the transfer element by replacing the atmosphere in that space by the vapor of the resist just before the stamper and the transfer element are brought into intimate contact with each other. In consequence, the pressure buildup that has occurred when the stamper and the transfer element are brought into intimate contact with each other is great enough to liquefy the vapor of the resist, so there will be no bubble defects of the type that has heretofore occurred. What is more, the resist does not mix with any dissimilar material but exists on its own, so there is no need to worry about deterioration of the resist.

DETAILED DESCRIPTION OF THE PREFERRED EMBODIMENTS

Figure 1:
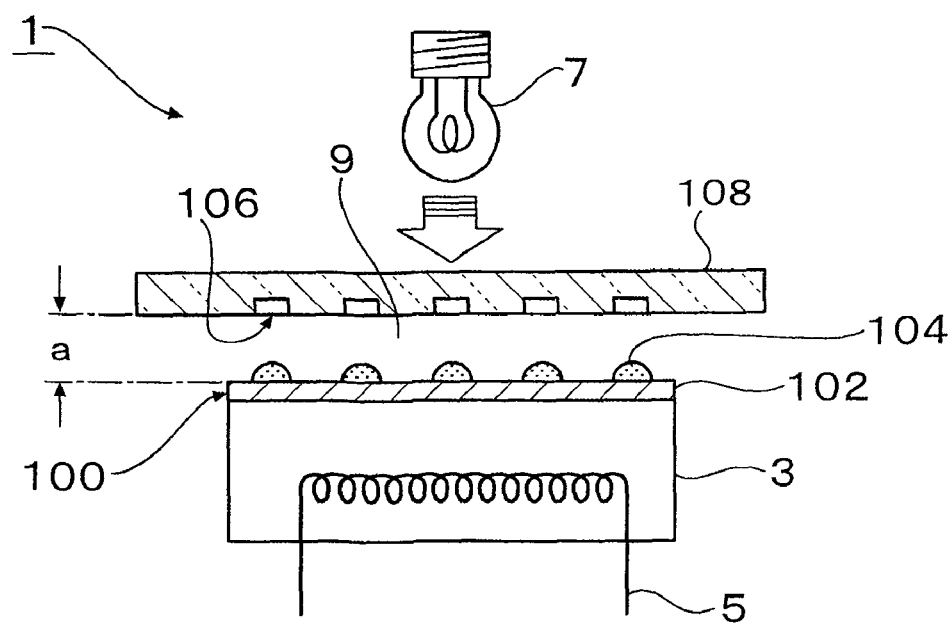
FIG. 1 is a diagram showing schematically an outline of an exemplary fine-structure transfer apparatus used to implement the fine-structure transfer method of the present invention.

On the following pages, the preferred embodiments of the present invention are specifically described with reference to the accompanying drawings as the invention relates to a fine-structure transfer method and apparatus. FIG. 1 is a diagram showing schematically an outline of an exemplary fine-structure transfer apparatus used to implement the fine-structure transfer method of the present invention. To simplify explanation, members which are the same as those in the prior art are described by using like numerals.

Figure 6A:
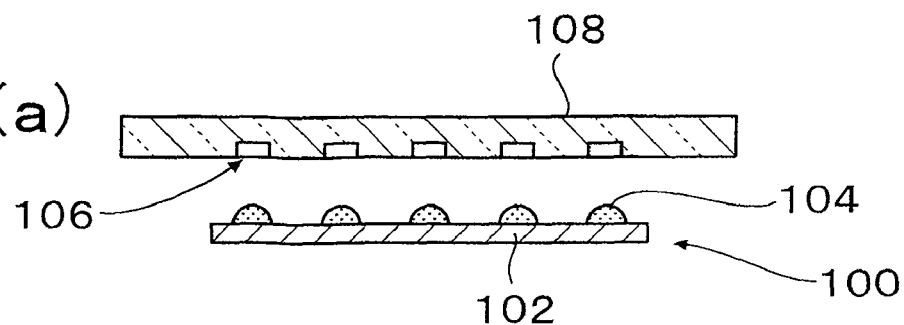
FIGS. 6(a)-6(d) are schematic diagrams showing major steps in a fine-structure transfer method involving the nanoimprint technology based on the optical transfer process.
Figure 6B:
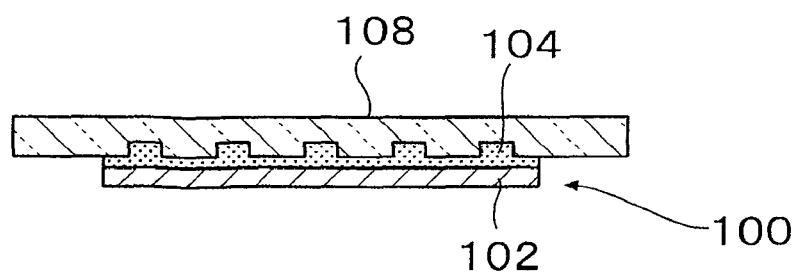
Figure 6C:
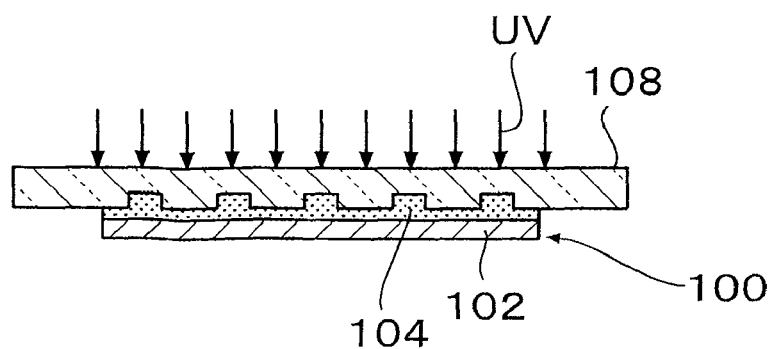
Figure 6D:
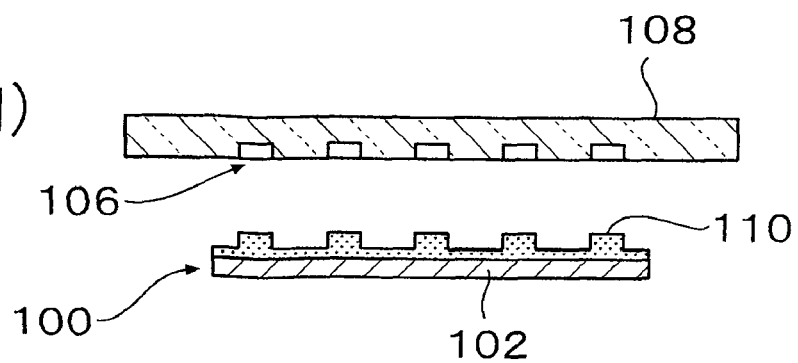

Reference is now made to FIG. 1. Briefly, the fine-structure transfer method of the present invention is characterized in that before a stamper 108 is pressed against a resist coating 104 on a substrate 102, the space 9 between the stamper 108 and the resist coating 104 on the substrate 102 is filled with the vapor of a resist to purge the air out of the space, and with the air purged from that space, the stamper 108 is pressed against the resist coating 104 on the substrate 102. Specifically, after adjusting the distance (a) between the stamper 108 and the topside of the substrate 102 to be close to a value between about 5 μm and 1 mm, the distance is held for a period of from about 50 milliseconds to a second, and the atmosphere in the space 9 between the stamper 108 and the resist coating 104 on the substrate 102 is replaced by the vapor of the resist; thereafter, the stamper 108 is brought into intimate contact with the transfer element 100. The vapor of the resist in the space between the stamper 108 and the resist coating 104 on the substrate 102 is liquefied under the pressure being exerted by the stamper 108 as it is pressed against the transfer element 100 and the liquefied vapor is absorbed and assimilated into the resist coating 104. Being identical to the material of which the resist coating 104 is made, the vapor of the resist will cause no adverse effects on the transferred patterned layer 110 (see FIG. 6(d)) that might otherwise lead to the formation of bubble defects in the patterned layer 110.

The resist to be used in the fine-structure transfer method of the present invention is preferably one that is easy to vaporize upon heating. The vapor pressure of the volatile component in the resist to be used in the present invention is preferably within the range from 500 MPa to 900 MPa. If the vapor pressure of the volatile component in the resist to be used in the present invention is in excess of 900 MPa, the resist will evaporate so rapidly after the substrate is coated with it that certain inconveniences may result from its loss, such as a change in its weight. On the other hand, if the vapor pressure of the volatile component in the resist to be used in the present invention is less than 500 MPa, a very high temperature is required to vaporize the resist by heating and thermal deformation of the substrate 102 or hardening of the heat-sensitive resist may potentially occur before the resist is vaporized, which is by no means preferable. The resist to be used in the present invention may be a synthetic resin material to which a photosensitive material has been added. Examples of the synthetic resin material that can be used include ones based on cycloolefin polymers, polymethyl methacrylate (PMMA), polystyrene polycarbonate, polyethylene terephthalate (PET), polylactic acid (PLA), polypropylene, polyethylene, polyvinyl alcohol (PVA), etc. Examples of the photosensitive material include peroxides, azo compounds (e.g., azobisisobutyronitrile), ketones(e.g., benzoin and acetone), diazoaminobenzene, metal-containing complex salts, dyes, etc.

Described below is the method of vaporizing the resist which is a required step in implementing the fine-structure transfer method of the present invention. A fine-structure transfer apparatus generally indicated by 1 which is used to implement the fine-structure transfer method of the present invention has a stage 3 on which to place the transfer element 100. Provided in the interior of the stage 3 is a heating means 5 for heating and vaporizing the resist coating 104 on the topside of the substrate 102 of the transfer element 100 placed on the topside of the stage 3. The heating means 5 may be selected from among various known conventional means including a heating wire, a Peltier device, hot fluid circulation, etc. If desired, in order to accelerate the vaporization of the resist coating 104, a heating light source 7 such as an infrared lamp or a halogen lamp may be provided above the stamper 108. The heating means 5 and the heating light source 7 may be used either individually or in combination. The heating light source 7 has the advantage of enabling efficient operation in a short period of time since it can heat the resist directly without causing a temperature elevation in the stage 3.

Figure 2:
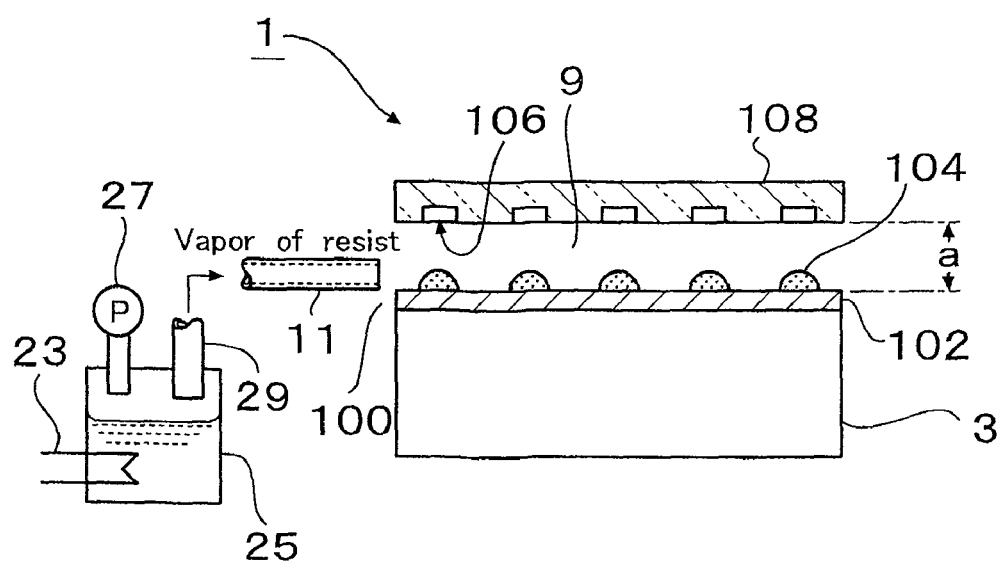
FIG. 2 is a diagram showing schematically an outline of another exemplary fine-structure transfer apparatus used to implement the fine-structure transfer method of the present invention.

Alternatively, in order to heat the resist and accelerate its vaporization, the embodiment shown in FIG. 2 may be employed; instead of the heating means 5 and/or heating light source 7, a nozzle 11 is provided and the vapor of a resist is blown through this nozzle into the space 9 between the stamper 108 and the resist coating 104 on the substrate 102 so that the atmosphere in the space 9 is forcibly replaced by the vapor of the resist. This method is efficient since it takes only a short time for the space 9 to be completely filled with the vapor of the resist. For instance, a solution of the resist within a tank 25 may be heated with a heater 23 to generate the vapor of the resist, which is forced through a pipe 29, with the pressure in the tank 25 enhanced by means of a pressure pump 27, so that it is ejected from the nozzle 11 to be blown into the space 9. Needless to say, the vapor of the resist can be generated by any other method.

Figure 3:
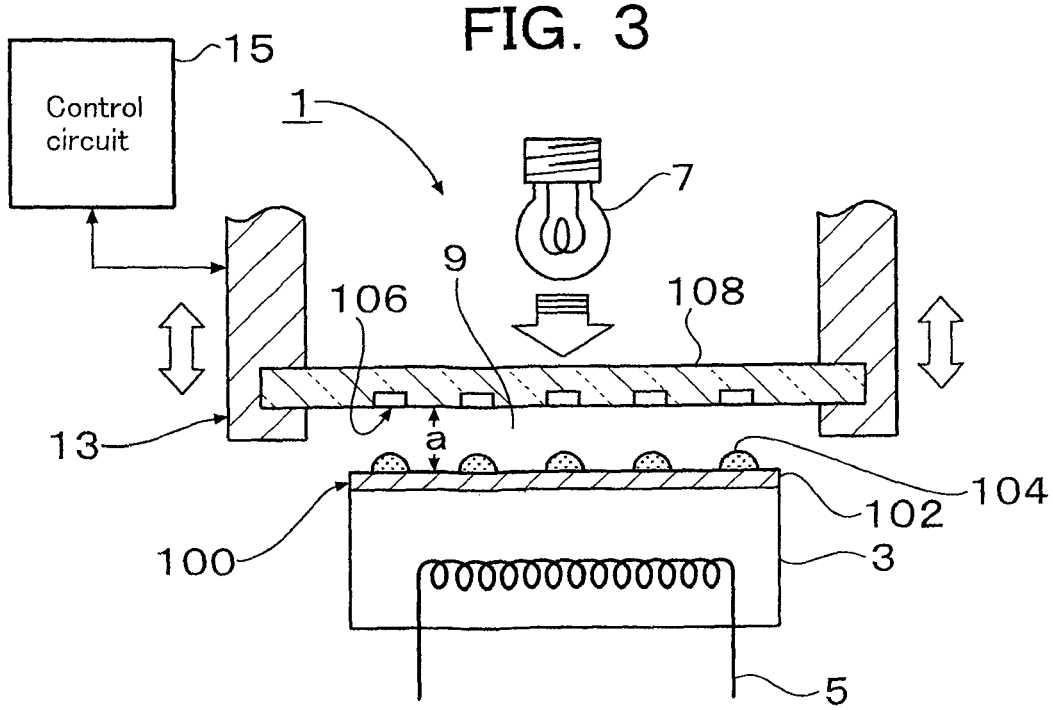
FIG. 3 is a diagram showing schematically an outline of an embodiment in which a mechanism for vertically moving a stamper and a circuit for controlling this mechanism are provided in the fine-structure transfer apparatus shown in FIG. 1.

The stamper 108 and the transfer element 100 can be brought into intimate contact with each other either by pressing the stamper 108 against the transfer element 100 or by pressing the transfer element 100 against the stamper 108. If the stamper 108 is to be pressed against the transfer element 100, the transfer element 100 is placed on the stage 3 and the stamper 108, held on a suitable mechanism 13 for moving it vertically, is pressed against the transfer element 100 by means of this mechanism, as shown in FIG. 3. In the case under consideration, the mechanism 13 for vertical movement of the stamper 108 is controlled by a control circuit such that it stops temporarily to keep the distance (a) between the stamper 108 and the topside of the substrate 102 for a predetermined period of time; after the atmosphere replacement is complete, the mechanism 13 for vertical movement of the stamper 108 is lowered to bring the stamper 108 into intimate contact with the transfer element 100.

Figure 4:
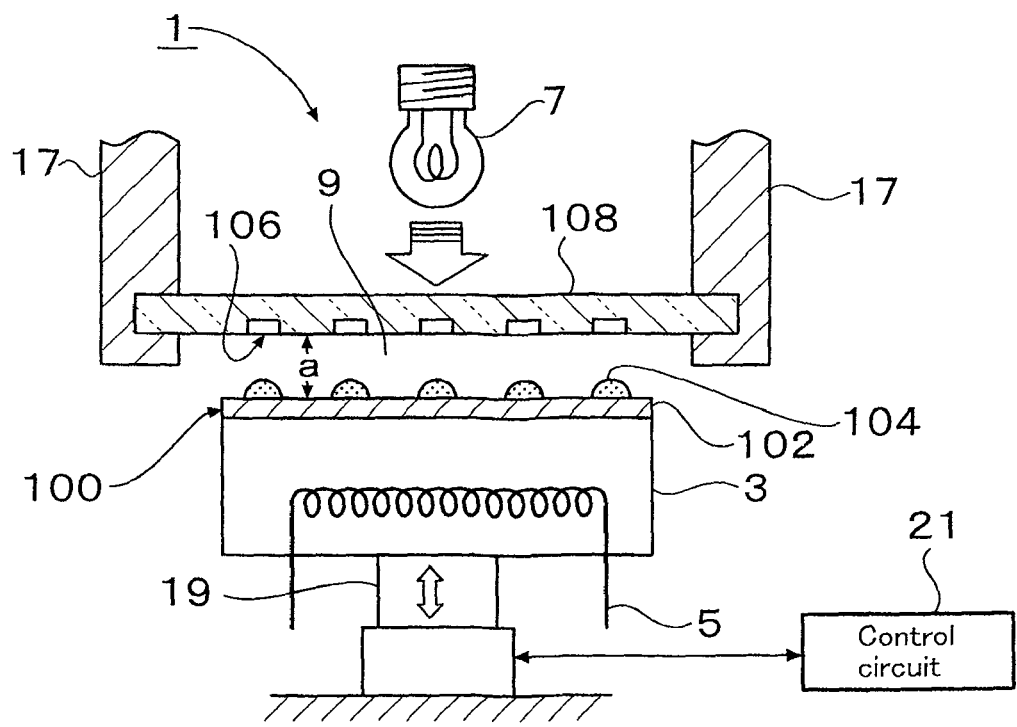
FIG. 4 is a diagram showing schematically an outline of an embodiment in which a mechanism for vertically moving a stage and a circuit for controlling this mechanism are provided in the fine-structure transfer apparatus shown in FIG. 1.

If the transfer element 100 is to be pressed against the stamper 108, the stamper 108 is fixed to a holding means 17 and the stage 3 is raised or lowered by a mechanism 19 for its vertical movement, as shown in FIG. 4. The mechanism 19 for moving the stage 3 vertically may be of any type that is known to and conventionally used by skilled artisans. The mechanism 19 for moving the stage 3 vertically is also controlled by a control circuit 21 such that it stops temporarily to keep the distance (a) between the stamper 108 and the topside of the substrate 102 for a predetermined period of time; after the atmosphere replacement is complete, the stage 3 is raised to bring the transfer element 100 into intimate contact with the stamper 108.

Figure 5:
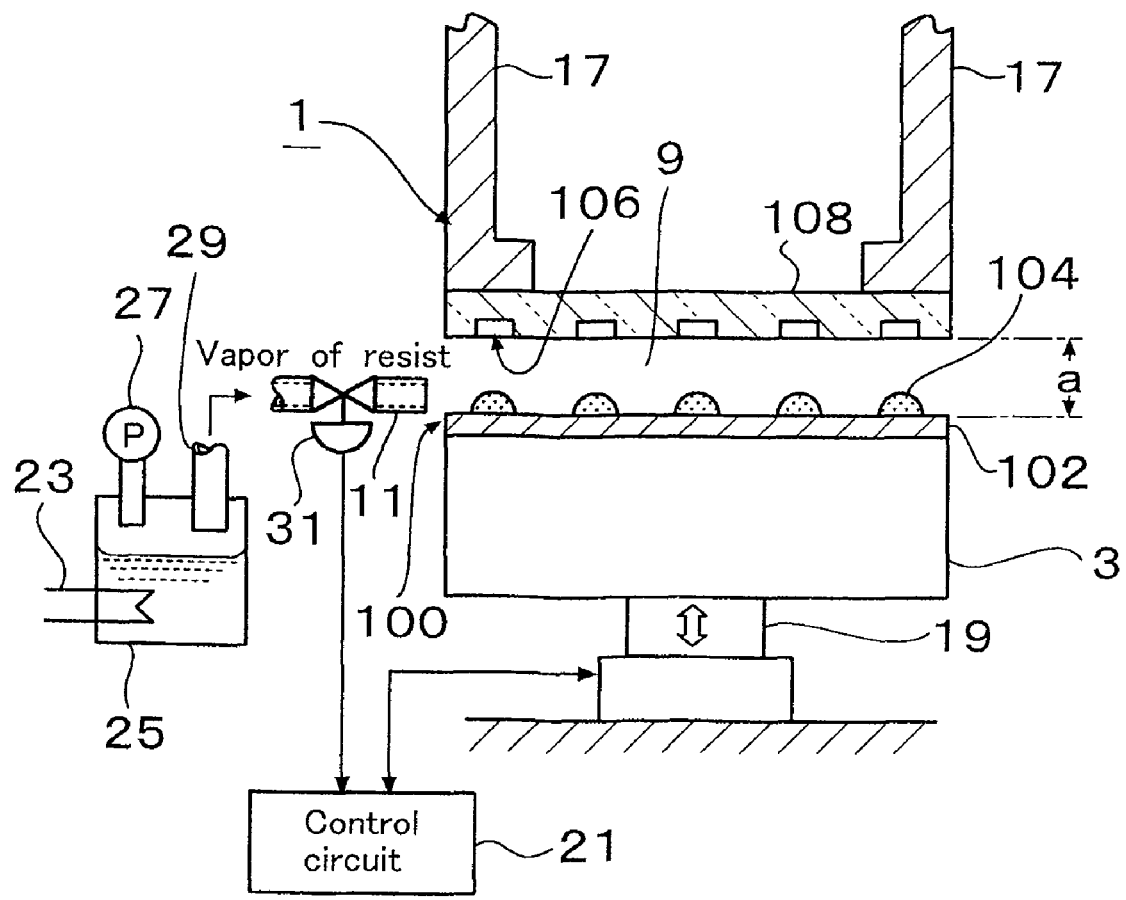
FIG. 5 is a diagram showing schematically an outline of an embodiment in which a mechanism for vertically moving a stage, a nozzle on/off valve mechanism, and a circuit for controlling these two mechanisms are provided in the fine-structure transfer apparatus shown in FIG. 2.

Consider the case where the vapor of the resist is to be ejected from the nozzle 11 so that it is blown into the space 9 between the stamper 108 and the resist coating 104 on the substrate 102. As typically shown in FIG. 5, the mechanism 19 for moving the stage 3 vertically is controlled by a control circuit 21 such that it stops temporarily to keep the distance (a) between the stamper 108 and the topside of the substrate 102 for a predetermined period of time and, simultaneously with this step, the control circuit 21 controls the on-off action of an on-off valve 31 on the nozzle 11. After the atmosphere replacement is complete, the control circuit 21 closes the on-off valve 31 on the nozzle 11 and raises the stage 3 so that the transfer element 100 is brought into intimate contact with the stamper 108. Needless to say, the apparatus shown in FIG. 3 which relies on the mechanism 13 for pressing the stamper 108 against the transfer element 100 may be adapted to operate in the same manner as just described above.

While the fine-structure transfer method and apparatus of the present invention have been described on the foregoing pages with reference to the preferred embodiments, it should be understood that the present invention is by no means limited to those embodiments but may be modified in various other ways. For example, the distance (a) between the stamper 108 and the topside of the substrate 102 need not necessarily be fixed (by causing either the stamper 108 or the transfer element 100 to stop temporarily) so as to effect the atmosphere replacement, but instead the distance (a) may be decreased continuously at a very slow speed to effect the atmosphere replacement.

What is claimed is:

1. A fine-structure transfer method for transferring a fine-featured pattern formed on a surface of a stamper, comprising:
   providing a stamper having a fine-featured pattern formed on a surface thereof and a transfer element including a surface opposed to the stamper;
   coating a resist onto the surface of the transfer element opposed to the stamper;
   vaporizing a resist, which is the same resist as the coating of resist on the transfer element;
   purging the space between the stamper and the transfer element by replacing the atmosphere between the stamper and the transfer element with the vaporized resist;
   pressing the stamper through the purged atmosphere onto the coating of resist so as to transfer the fine-featured pattern onto the resist coating.

2. The fine-structure transfer method according to claim 1, wherein before the stamper is pressed against the transfer element, the distance between the stamper and the transfer element is maintained within the range from 5 μm to 1 mm for a period of 5 milliseconds to a second, whereby the atmosphere in the space between the stamper and the transfer element is replaced by the vapor of the resist.

3. The fine-structure transfer method according to claim 1, wherein the resist coating on the opposed surface of the transfer element is heated until a vapor of the resist is generated so that the atmosphere in the space between the stamper and the transfer element is replaced by the vapor of the resist.

4. The fine-structure transfer method according to claim 1, wherein the vapor of the resist is generated in a separate step and is blown through a nozzle into the space between the stamper and the transfer element so that the atmosphere in the space between the stamper and the transfer element is replaced by the vapor of the resist.

5. The fine-structure transfer method according to claim 2, wherein the resist coating on the transfer element is heated until a vapor of the resist is generated so that the atmosphere in the space between the stamper and the transfer element is replaced by the vapor of the resist.

6. The fine-structure transfer method according to claim 2, wherein the vapor of the resist is generated in a separate step and is blown through a nozzle into the space between the stamper and the transfer element so that the atmosphere in the space between the stamper and the transfer element is replaced by the vapor of the resist.

7. The fine-structured method according to claim 1, which further includes liquefying the vapor of the resist by exerting sufficient pressure by the stamper as it is pressed against the transfer element until the vapor of the resist is liquefied.

\* \* \* \* \*